United States Patent
Schulz-Harder

(10) Patent No.: US 6,297,469 B1
(45) Date of Patent: Oct. 2, 2001

(54) PROCESS FOR PRODUCING A METAL-CERAMIC SUBSTRATE

(76) Inventor: Jurgen Schulz-Harder, Hugo-Dietz-Strasse 32, D-91207 Lauf (DE)

( * ) Notice: Subject to any disclaimer, the term of this patent is extended or adjusted under 35 U.S.C. 154(b) by 0 days.

(21) Appl. No.: 09/330,999

(22) Filed: Jun. 14, 1999

(30) Foreign Application Priority Data

Jun. 19, 1998 (DE) .............................. 198 27 414

(51) Int. Cl.$^7$ .................................................. B23K 26/00
(52) U.S. Cl. ............................. 219/121.71; 219/121.7; 427/555
(58) Field of Search .......................... 219/121.7, 121.71; 264/400; 427/555, 581, 98, 125, 305, 443.1

(56) References Cited

U.S. PATENT DOCUMENTS

| | | | | |
|---|---|---|---|---|
| 3,742,182 | * | 6/1973 | Saunders | 219/121 |
| 4,390,774 | * | 6/1983 | Steen et al. | 219/121 |
| 4,650,619 | * | 3/1987 | Watanabe | 264/25 |
| 4,780,177 | * | 10/1988 | Wajnarowski et al. | 156/643 |
| 5,079,600 | * | 1/1992 | Schnur et al. | 357/4 |
| 5,103,073 | * | 4/1992 | Danilov et al. | 219/121.68 |
| 5,345,057 | * | 9/1994 | Muller | 219/121.71 |
| 5,386,430 | * | 1/1995 | Yamagishi et al. | 372/57 |
| 5,676,855 | * | 10/1997 | Schulz-Harder | 216/52 |
| 5,721,044 | * | 2/1998 | Schmidt et al. | 428/210 |
| 5,849,355 | * | 12/1998 | McHenry | 427/79 |
| 5,994,667 | * | 11/1999 | Merdan et al. | 219/121.67 |
| 6,162,365 | * | 12/2000 | Bhatt et al. | 216/13 |

FOREIGN PATENT DOCUMENTS

| | | |
|---|---|---|
| 23 129854 C2 | 4/1973 | (DE) . |
| 64/50580-A | * 2/1989 | (JP) ...................... 505/741 |

* cited by examiner

*Primary Examiner*—Randy Gulakowski
*Assistant Examiner*—Jiri Smetana
(74) *Attorney, Agent, or Firm*—Hoffman, Wasson & Gitler

(57) ABSTRACT

The invention relates to a novel process for producing a metal-ceramic substrate in which at least one surface side of the ceramic layer is provided with at least one first structured metal layer and at least one second metal layer is applied to the first by electroless chemical deposition, and in which at least one depression or hole, or a plurality of depressions or holes are formed in the ceramic layer by laser machining to form a scored line.

23 Claims, 2 Drawing Sheets

PROCESS FOR PRODUCING A METAL-CERAMIC SUBSTRATE

BACKGROUND OF THE INVENTION

The invention relates to a process for producing a metal-ceramic substrate for electric circuits or components. At least one side of the ceramic layer is provided with at least one structured metal layer. A second metal layer is applied to the first structured metal layer by electroless chemical deposition.

Producing a metal coating necessary for manufacturing printed circuits, terminals, etc. on a ceramic, for example on an aluminum oxide ceramic with the so-called "DCB process" (direct copper bond technology) using metal, or copper foils, or metal, or copper sheets, which form the metal coating and which on their surface sides have a layer or a coating (melted-on layer) of a chemical compound of the metal and a reactive gas, preferably oxygen, has been undertaken. In this process, which is described for example in U.S. Pat. No. 3,744,120, or in U.S. DE Pat. No. 2,319,854, this layer or coating (melted-on layer), forms an eutectic with a melting point below the melting point of the metal (for example, copper) so that by placing the foil on the ceramic, and by heating all the layers, they can be joined to one another by melting on the metal, or copper, in the area of the melted-on layer, or oxide layer.

This DCB process has the following process steps, for example:

oxidizing a copper foil such that a uniform copper layer results;

placing the copper foil on the ceramic layer;

heating the composite to a process temperature between roughly 1065° C. and 1083° C., for example to roughly 1071° C.;

cooling to room temperature.

Furthermore, it is known to use laser machining, or treatment, of the ceramic (for example, Guenter Spur *Machining of Ceramics,* Hauser Verlag, ISDN 9-446-15620-8).

Previously, the ceramic is either cut, or blind hole-like depressions are made in the ceramic by individual pulses, for example, for producing scored lines on which a multiple substrate can be separated into individual substrates by breaking. However, laser treatment can be used for other purposes. The spacing of the holes is, for example 0.1–0.5 mm and the penetration depth of treatment is between 2–70% of the ceramic thickness.

For example, $CO_2$ lasers or Nd-YA6 lasers are suited for laser machining.

Production of metal-ceramic substrates with laser-treated ceramic layers is accomplished as follows, especially when using the DCB process: First, the bare ceramic layer, i.e. not yet provided with a metal layer, is treated using the laser along the desired scored lines. Then the first metal layers are applied, for example in the form of copper foils, and using the DCB process, or an active soldering process. In another process step, this first metal layer is structured in the required manner using known etching and masking techniques, in which first an etching mask is produced, for example by stencil printing, or photoprinting, and then, the required structuring or the required layout is produced using this mask by etching.

Another metal layer is then produced on the structured first metal layer, for example, by electroless chemical deposition in the corresponding baths.

Along the scored lines produced by laser machining, the multiple substrate can be divided into the individual substrates by breaking.

The known process in which laser machining is done before applying the metal coating has the defect that at the start of the production process, product-oriented laser machining of the ceramics is necessary and thus also product-oriented storage is necessary, with the disadvantage of high storage costs and long passage times. Furthermore, there is the danger that the respective laser-treated bare ceramic will break in an unwanted manner during application of the first metal layers or during the handling necessary for this purpose.

If laser machining is done as the last step at the end of the production process, i.e. after electroless chemical deposition of the second metal layers, this has the defect that the substrate surface is highly fouled by the plasma which is released in laser machining. Longer residence times and/or heating during laser machining can also lead in an undesirable manner to corrosion of the surface of the metal coatings formed by the metal layers; this adversely affects further use of the substrate, for example, leading to reduced solderability or wire bondability of the surface of the metal coatings.

Attempts to undertake laser machining after structuring of the first metal surfaces and before electroless or chemical application of the other metal layers have not lead to any useful results to date. In particular, it has been found that metal is deposited in electroless chemical deposition on the edges and on the bottom of the scratches, or notches, or holes, produced by laser machining. This undesirable metal coating, which is located on the edge of the individual substrates, after separating the multiple substrate into the individual substrates, leads to a reduction of the dielectric strength between the top and bottom of the individual substrates.

It is an object of the invention is to devise a process which avoids the defects of the known processes, especially expensive product-oriented storage of ceramics.

SUMMARY OF THE INVENTION

In the process, as claimed in the invention, laser machining takes place after structuring of at least one first metal layer and before the electroless chemical application of at least one second metal layer.

It has been surprisingly found that during electroless chemical deposition of at least one other metal layer, no metal is deposited on the edges and bottoms of the scratches, or notches, produced by laser treatment when laser machining takes place, according to the process as claimed in the invention, i.e especially under an atmosphere which contains at least 30% oxygen.

BRIEF DESCRIPTION OF THE DRAWINGS

An embodiment of the invention is detailed below using the following figures.

DETAILED DESCRIPTION OF THE INVENTION

Figure 1:
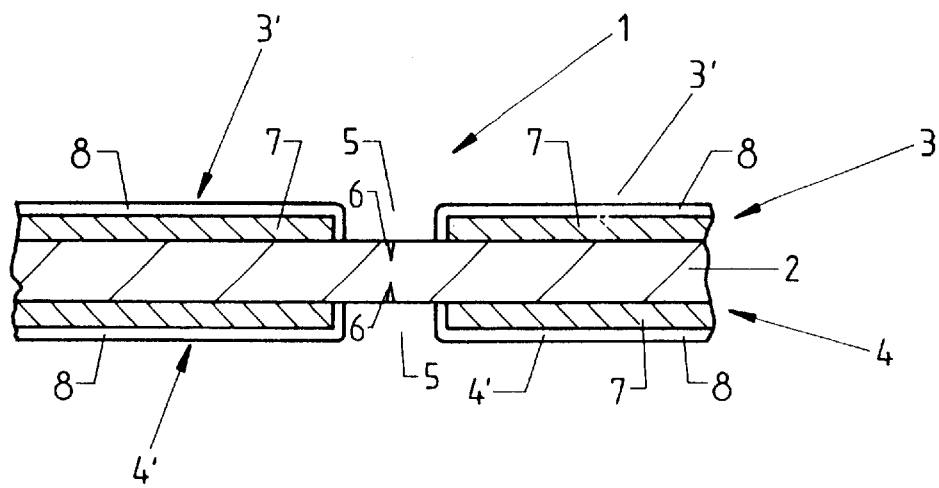
FIG. 1 shows a structured substrate produced using the process as claimed in the invention.

The multiple substrate generally labelled 1 in FIG. 1 contains a rectangular, or quadratic, ceramic layer or ceramic plate 2, which, for example, is an aluminum oxide ceramic, or another ceramic, for example, AlN, $Si_3N_4$ or SiC. On the top and bottom surface of the ceramic layer 2 there is one metal coating 3, and 4, respectively; they are structured in the required manner. In the embodiment shown, the metal coatings 3, and 4, each form individual metal coatings 3' and 4' which are provided on the top and bottom of the ceramic layer in several rows and columns which run parallel to the peripheral sides of the ceramic layer 2. The individual metal coatings 3' and 4', on the top and bottom of the ceramic layer 2, are separated from one another by structuring on strip-shaped areas 5 which run parallel to the peripheral sides of the ceramic layer 2, and on which the ceramic is exposed. On the areas 5 the ceramic layer 2 is furthermore provided top and bottom with scored lines which are formed by notches 6. One notch 6 on the top of the ceramic layer 2 is opposite one notch 6 on the bottom of this ceramic layer.

The scored lines which are formed by the notches 6 make it possible to separate the substrate 1 by breaking it into individual substrates which each consist of the individual metal coatings 3' and 4' and the interposed part of the ceramic layer 2. The notches 6 are produced by laser machining or by laser scratching, i.e. using a laser, for example a $CO_2$ laser or a Nd-YA6 laser. Instead of continuous notches 6, point depressions or holes which follow one another in the longitudinal direction of the respective area 5 can be produced in the ceramic layer 2 by burning-in using the laser, these holes, in their entirety, form the respective scored line.

The metal coatings 3 and 4, and the individual metal coatings 3' and 4', each consist of a copper layer 7 which is joined superficially directly to the pertinent surface of the ceramic layer 2 and have a thickness, for example, of 200–500 microns. The surface metal coating, or metal layer 8, which has been produced by electroless and chemical deposition of metal on the copper layer 7, has a thickness which is less than the thickness of copper layer 7. The metal layer 8 consists, for example, of nickel, palladium, tin, gold, copper, or combinations thereof.

The multiple substrate 1 is preferably used such that the individual metal coatings 3' and 4' are first structured using a conventional technique, for example a masking and etching technique, in the required manner and the multiple substrate 1, only then, or after installing electrical components, is separated along the scoring formed by the notches 6, or holes at the regions 5, into individual substrates by breaking.

Figure 2:
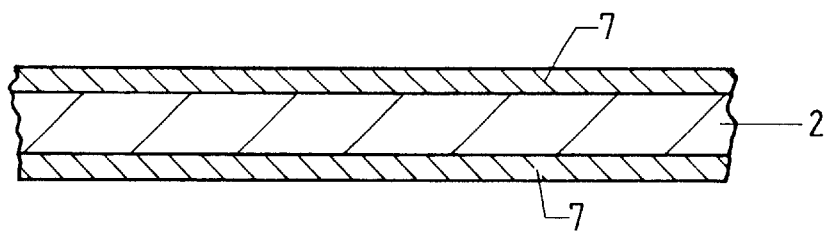
FIGS. 2–7 show the important process steps for producing the substrate of FIG. 1.

The multiple substrate 1 is produced for example in the manner described below in conjunction with FIGS. 2–7:

According to FIG. 2, the ceramic layer 2 on its top and bottom is provided with one copper layer 7, each which extends first over the entire surface of the top and bottom of the ceramic layer 2. The copper layers 7 are formed, for example, by copper foils with a thickness between 200–500 microns which are applied using the DCB technique, or using another technique known to one skilled in the art, for example, using an active soldering process. It is also possible to produce at least one of the two copper layers 7 as a thick copper film using a known thick film process.

The ceramic layer 2 can, as detailed above, be a ceramic of a different type, for example, $Al_2O_3$, AlN, $Si_3N_4$, or SiC.

Figure 3:
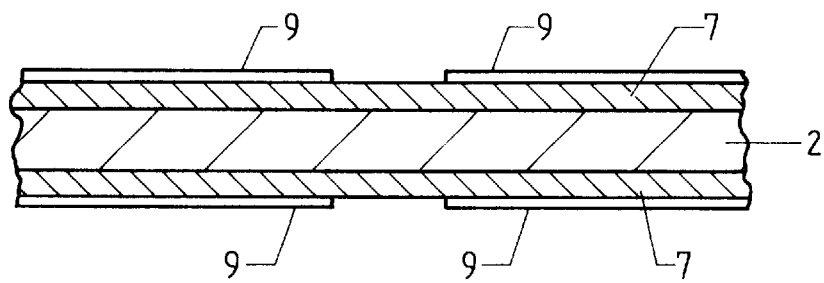
Figure 4:
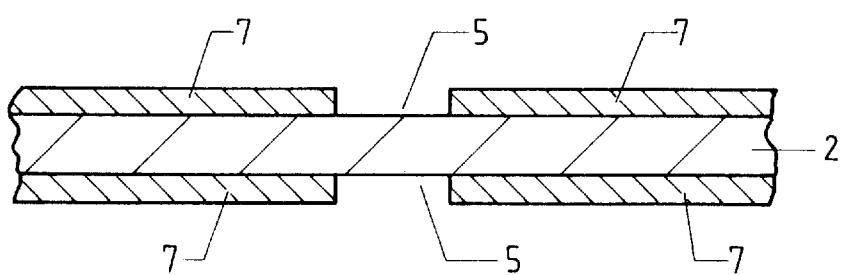

According to FIGS. 3 and 4, structuring of the copper layers 7 takes place in further process steps, especially to produce the areas 5 on which the ceramic layer 2 is then exposed and of which in the embodiment shown, one area 5 on the top of the ceramic layer 2 is opposite one area 5 on the bottom of the ceramic layer 2. This structuring is done with a known etching technique. To do this, one layer of photoresist is applied to the exposed surface sides of the copper layers 7; the photoresist forms an etching mask 9, which covers the copper layers 7 on the breaks which are not to be etched. By etching and subsequent removal of the mask 9 the areas 5 are produced in the copper layers 7 on which the ceramic layer 2 is exposed.

Figure 5:
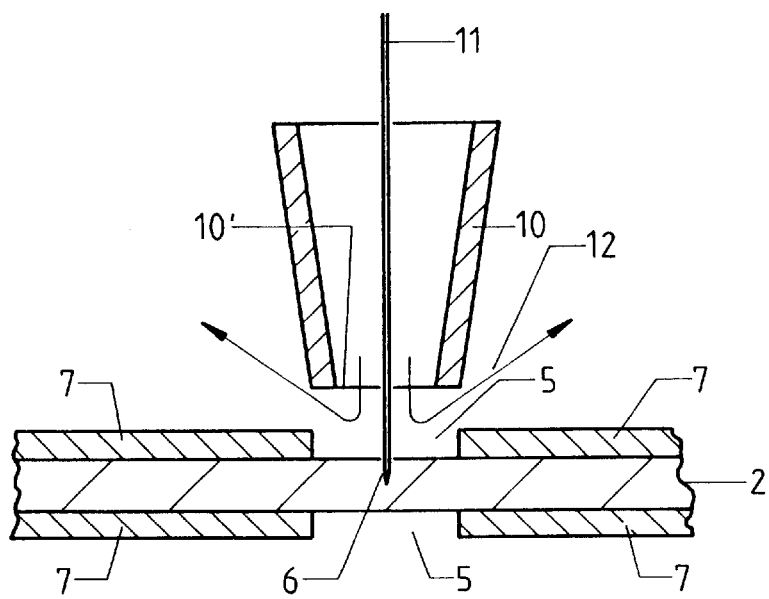
Figure 6:
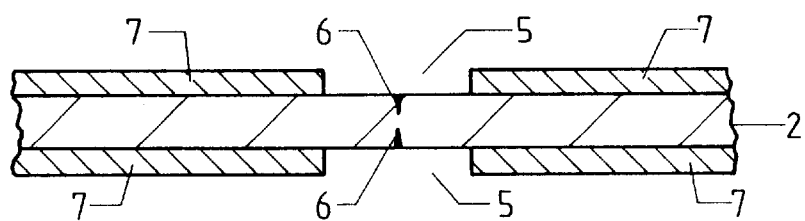

In another process step, according to FIG. 5, laser machining takes place, i.e. forming of notches 6 or the corresponding holes at least on one surface side of the ceramic layer 2 along the areas 5 there. In the embodiment shown, this laser machining is done on both sides of the ceramic layer 2, for example, first on the top and then, after turning, also on the bottom so that the result shown in FIG. 6 is obtained. Here it is significant that laser machining is done in an atmosphere containing a high percentage of oxygen, i.e. at least 30–35%. To do this, for laser machining, a nozzle 10 is used through which the laser beam 11 is guided and on which a gas flow 12 emerges and directly strikes the area on which the ceramic layer 2 is being treated with the laser beam 11. The gas flow 12 is, for example, oxygen-enriched air or industrial oxygen.

It has been found that laser machining in the oxygen atmosphere effectively prevents nuclei in the area of the notches 6 which can cause undesirable deposition of metal on the notches 6 in later electroless or chemical application of the metal layer 8.

The nozzle 10 with its bottom open end 10' is located as tightly as possible on the substrate, for example, at a distance of at most 5 mm. The pressure in the nozzle 10 is at least 50 kilopascals.

Figure 7:
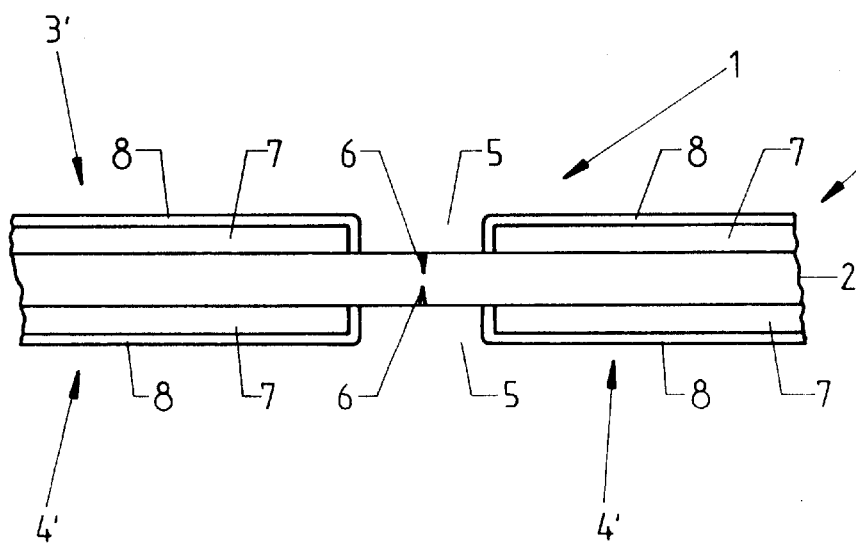

According to FIG. 7, in a electroless process step, the metal layer 8, is chemically deposited only where this substrate is activated for chemical deposition, specifically on the exposed surfaces of the structured copper layer 7. By exposing the surface of the ceramic layer 2 to oxygen during laser machining, there is no metal application in this electroless chemical metal application on the areas 5, or on the notches 6, so that in particular, there is produced the required dielectric strength for the individual substrates. This is accomplished, even though the laser machining to achieve scored lines (notches 6 or laser holes) is done after applying and structuring the copper layers 7. The above described process especially offers the advantage that using ceramic layers 2, which have been provided with copper layers 7, and the layout of the respective multiple substrate 1, or the production of individual metal coatings 3' and 4' can take place individually, according to special requirements or customer requests. This would not be possible if the scored lines, or the corresponding notches 6, or laser holes, were made before applying the first surface metal layer (copper layers 7) and before structuring of this metal layer.

Various modifications or additional process steps are conceivable for the above described process. It is possible to clean the surface of the substrate and its copper surface by alkali treatment before electroless chemical metal application (metal layer 8), preferably after laser machining. This is done to remove residues formed during laser machining or to slightly etch off the surface of the copper layers 7. The thickness of the partial copper layer removed in this etching being, for example, 0.1–50 microns.

Instead of, or in addition to, this surface treatment, it is also possible to activate the surface of the copper layers 7, on which the metal layer 8 is to be chemically deposited, without current in a manner suitable for this purpose.

For electroless chemical metal application, for example, Ni-phosphorus, or Ni-boron, with palladium chloride, is suited for activation. Chemically deposited tin or copper is also suitable.

Furthermore, it is possible to apply at least one other metal layer to the metal layer 8, by electroless chemical metal application. The further metal layers can be, for example, gold, palladium, etc.

As is illustrated in FIG. 5, by structuring the copper layer 7 in laser machining, the oxygen which has emerged from the nozzle 10 is retained in the respective area 5 against overly rapid escape so that a relatively long residence time for the oxygen is achieved at the laser machining site.

The invention was described above using various embodiments. Other modifications are possible without departing from the inventive idea underlying the invention.

REFERENCE NUMBER LIST

1 multiple substrate
2 ceramic layer
3,4 metal coating
3',4' individual metal coating
5 exposed area of the ceramic layer
6 notch
7 copper layer
8 metal layer
9 mask
10 nozzle
10' nozzle opening
11 laser beam
12 gas jet with high percentage of oxygen

What is claimed is:

1. A process for producing a metal-ceramic substrate, in which at least one surface side of a ceramic layer is provided with at least one first structured metal layer and at least one second metal layer applied to the first structured metal layer by electroless chemical deposition, and in which at least one depression or hole, or a plurality of depressions or holes are formed in the ceramic layer by laser machining to form a scored line, wherein the laser machining is done after the first structured metal layer is produced in an atmosphere containing at least 30% by volume oxygen.

2. The process as claimed in claim 1, wherein first and second surface sides of the ceramic layer are provided each with the first structured metal layer and the at least one second metal layer is deposited with electroless chemical deposition on the at least one first metal layer.

3. The process as claimed in claim 1, wherein laser machining is done on both surface sides of the ceramic layer.

4. The process as claimed in claim 1, wherein the first metal layer is structured by an etching and masking technique.

5. The process as claimed in claim 1, wherein the first metal layer is applied in the form of a metal foil by means of a direct bonding process.

6. The process as claimed in claim 1, wherein the first metal layer is applied in the form of a metal foil using an active soldering process.

7. The process as claimed in claim 1, wherein the first metal layer is applied using a thick film technique.

8. The process as claimed in claim 1, wherein the first metal layer consists of copper or a copper alloy.

9. The process as claimed in claim 1, wherein the first metal layer is applied with a thickness of 200–500 microns.

10. The process as claimed in claim 1, wherein the ceramic layer is selected from the group consisting of $Al_2O_3$, AlN, $Si_3N_4$, and SiC.

11. The process as claimed in claim 1, wherein a laser with a wavelength of approximately 10 microns is used for laser treatment.

12. The process as claimed in claim 1, wherein a laser with a wave length of approximately 1 micron is used for laser treatment.

13. The process as claimed in claim 1, wherein the metal ceramic substrate is chemically or mechanically cleaned after laser machining.

14. The process as claimed in claim 13, wherein the cleaning takes place by alkali treatment or by etching off a thin partial surface layer of the first metal layer.

15. The process as claimed in claim 1, wherein a surface of the first metal layer is activated before chemical deposition of the at least one second metal layer.

16. The process as claimed in claim 1, wherein chemical deposition or metal coating takes place using Ni-phosphorus or Ni-boron with activation by palladium chloride, chemical tin or chemical copper.

17. The process as claimed in claim 1, wherein at least one more metal layer is produced on at least a part of the second metal layer by electroless chemical deposition.

18. The process as claimed in claim 17, wherein the at least one additional metal layer or the at least one second metal layer is gold or palladium and is applied by chemical deposition.

19. The process as claimed in claim 1, wherein laser treatment takes place in an oxygen-enriched air or gas flow.

20. The process as claimed in claim 1, wherein laser treatment takes place in a stream of oxygen.

21. The process as claimed in claim 1, wherein laser treatment takes place through a nozzle, from which, in addition to a laser beam, an air or gas stream also emerges.

22. The process as claimed in claim 21, wherein a distance between the nozzle and the metal-ceramic substrate in laser machining is less than or equal to 5 mm.

23. The process as claimed in claim 21, wherein the nozzle is exposed to a gas pressure of at least 50 kPa.

* * * * *